United States Patent
Barthelmess et al.

(10) Patent No.: US 8,946,867 B2
(45) Date of Patent: Feb. 3, 2015

(54) SEMICONDUCTOR COMPONENT WITH OPTIMIZED EDGE TERMINATION

(75) Inventors: Reiner Barthelmess, Soest (DE); Hans-Joachim Schulze, Taufkirchen (DE); Uwe Kellner-Werdehausen, Leutenbach (DE); Josef Lutz, Chemnitz (DE); Thomas Basler, Chemnitz (DE)

(73) Assignee: Infineon Technologies Bipolar GmbH & Co. KG (DE)

( * ) Notice: Subject to any disclaimer, the term of this patent is extended or adjusted under 35 U.S.C. 154(b) by 0 days.

(21) Appl. No.: 14/361,376

(22) PCT Filed: Sep. 6, 2012

(86) PCT No.: PCT/EP2012/067441
§ 371 (c)(1),
(2), (4) Date: May 29, 2014

(87) PCT Pub. No.: WO2013/079235
PCT Pub. Date: Jun. 6, 2013

(65) Prior Publication Data
US 2014/0327114 A1    Nov. 6, 2014

(30) Foreign Application Priority Data

Nov. 30, 2011    (DE) .......................... 10 2011 087 487

(51) Int. Cl.
*H01L 29/861* (2006.01)
*H01L 29/06* (2006.01)
*H01L 29/36* (2006.01)

(52) U.S. Cl.
CPC ............ *H01L 29/0657* (2013.01); *H01L 29/36* (2013.01); *H01L 29/861* (2013.01)
USPC ............ 257/618; 257/171; 257/605; 257/623

(58) Field of Classification Search
USPC ................................. 257/117, 605, 618, 623
See application file for complete search history.

(56) References Cited

U.S. PATENT DOCUMENTS

| 4,220,963 A | 9/1980 | Rumennik |
| 6,037,632 A | 3/2000 | Omura et al. |
| 2009/0267200 A1 | 10/2009 | Gutt et al. |

FOREIGN PATENT DOCUMENTS

| DE | 10361136 A1 | 7/2005 |
| JP | 60066477 A | 4/1985 |

OTHER PUBLICATIONS

B. Heinze et al. "Ruggedness analysis of 3.3kV high voltage diodes considering various buffer structures and edge terminations", Microelectronics Journal, Mackintosh Publications Ltd., Jun. 1, 2008, pp. 868-877, vol. 39, No. 6; XP022688211.
International Search Report issued Dec. 18, 2012 re: PCT/EP2012/067441; citing: US 4 220 963 A, US 6 037 632 A, US 2009/267200 A1, Heinze et al., DE 103 61 136 A1 and JP 60 066477 A.

*Primary Examiner* — Marc Armand
*Assistant Examiner* — Tifney Skyles
(74) *Attorney, Agent, or Firm* — Cantor Colburn LLP

(57) ABSTRACT

A semiconductor component includes
a two-sided semiconductor body,
an inner zone with a basic doping of a first conduction type, and two semiconductor zones. The first zone, disposed between the first side and inner zone, is of the first conduction type with a doping concentration higher than that of the inner zone. The second zone, disposed between the second side and inner zone, is of a second conduction type complementary to the first type with a doping concentration higher than that of the inner zone.
At least one first edge chamfer extends at a first angle to the extension plane of the transition from the second zone to the inner zone at least along the edge of the second zone and inner zone.
At least one buried zone of the second conduction type is provided between the first zone and inner zone, and extends substantially parallel to the first zone.

9 Claims, 7 Drawing Sheets

SEMICONDUCTOR COMPONENT WITH OPTIMIZED EDGE TERMINATION

FIELD

The disclosure relates to a semiconductor component, particularly a disk cell diode.

BACKGROUND

It is known per se that the edge design of semiconductor components, particularly of power semiconductor components, has a considerable influence on the achievable blocking voltage strength of the component. Generally, the edge structures of semiconductor components can be divided into two main groups: edge structures in which an angle at which, for example, a p-n transition intersects the semiconductor surface is set on the semiconductor body by means of an edge chamfer, and edge structures with a plane semiconductor surface which are referred to as planar edge structures.

The edge chamfer in the edge region of the semiconductor component can be produced both mechanically, for example by grinding or lapping, and chemically by targeted etching. The angle of the edge chamfer is generally defined in relation to a transition from a semiconductor zone doped to a higher degree to one doped to a lesser degree, wherein this angle is referred to as a positive angle in the case in which the diameter of the semiconductor body decreases in the direction from the semiconductor zone doped to a higher degree to the semiconductor zone doped to a lesser degree, and otherwise as a negative angle.

In typical semiconductor components, particularly in disk cell diodes, a positive angle is usually provided as an edge termination. This angle causes a widening of the space-charge zone, so that the latter, given the dimensionings of the basic doping of an inner zone of the semiconductor body common today, abuts the heavily n-doped emitter already at relatively low applied blocking voltages. This results in excessive field strengths occurring in the region of the positive angle at the transition between lightly n-doped and the heavily n-doped area. These field peaks are critical particularly when, during a turn-off process with a high steepness of commutation, a high density of free electrons occurs at this location and locally divides the field curve. This can result in the failure of the semiconductor component. The angle range for a positive chamfer typically lies between about 25° to about 50°.

In particular, in semiconductor components with an edge chamfer with a positive angle, the anode surface at the side of the edge is larger compared to the cathode surface at the side of the edge, so that in the on-state an increased current density can occur at the edge of the semiconductor component on the side of the cathode. Since the stored charge is proportional to the current density, a dynamic avalanche will preferably occur in the region of the edge.

So far, it is provided as a countermeasure that a second edge chamfer with a shallower angle, particularly a shallow negative angle, is etched, in addition to the positive edge chamfer, into the semiconductor body, in the outer or edge region of the heavily n-doped emitter of the semiconductor component. This is usually done by means of spin etching. However, this is disadvantageous in that this method results in an edge contour that is difficult to reproduce, and thus in fluctuations of the electrical properties from component to component. In particular, components with local weak points, particularly excessive field strengths, at the above-mentioned location may sporadically occur.

Thus, a need exists for providing a semiconductor component in which excessive field strength peaks in the edge region, which occur during the turn-off process of the semiconductor component, are specifically avoided. Furthermore, the semiconductor components are supposed to be easier and more accurate to reproduce and have a lower level of fluctuation in the electrical properties, particularly during the turn-off or depletion phase of the semiconductor component.

SUMMARY

According to the disclosure, a semiconductor component, in particular a disk cell diode, comprises a semiconductor body with a first side, a second side and an edge; moreover an inner zone with a basic doping of a first conduction type; a first semiconductor zone, which is disposed between the first side and the inner zone and is of the first conduction type with a doping concentration higher than the doping concentration of the inner zone; a second semiconductor zone, which is disposed between the second side and the inner zone and is of a second conduction type complementary to the first conduction type and has a doping concentration higher than the doping concentration of the inner zone; and at least one first edge chamfer extending at a first angle to the extension plane of the transition from the second semiconductor zone to the inner zone at least along the edge of the second semiconductor zone and the inner zone. According to the disclosure, at least one buried semiconductor zone of the second conduction type with a doping concentration higher than that of the inner zone is provided between the first semiconductor zone and the inner zone, wherein this buried semiconductor zone extends substantially parallel to the first semiconductor zone.

A semiconductor zone is referred to as being buried within the sense of the disclosure if it is adjacent neither to the first, nor to the second side of the semiconductor body, but is disposed in the vertical direction inside the semiconductor body. Within the sense of the disclosure, the buried semiconductor zone can merely come up to the edge of the semiconductor body.

In the on-state of the semiconductor component, the at least one buried semiconductor zone of the second conduction type causes a reduction of the current density at the edge of the semiconductor body. Thus, a dynamic avalanche in the blocking state of the semiconductor component will occur with a delay. During the transition from the on-state into the blocking state, the charges in the semiconductor body are depleted. It is not until the depletion process that follows the on-state that an avalanche or a dynamic avalanche can occur. This then preferably occurs in the edge region of the semiconductor body, and its extent becomes more critical the higher the current density in the edge region was prior to turning off. This can be prevented by means of the buried semiconductor zone of the second conduction type, because it effectively prevents a high charge density, and thus a high current density, in the edge region already during the on-phase.

If a dynamic avalanche occurs, the buried semiconductor zone injects charge carriers of the second charge type, for example holes in the case of p-type doping, which are capable of at least partially compensating the charge carriers generated in a semiconductor zone of the semiconductor body due to the dynamic avalanche, electrons in the case of an n-doped semiconductor zone. Furthermore, the production of the buried semiconductor zone, for example by means of predeposition or ion implantation and a subsequent drive-in step, permits an exact reproducibility, and this results in smaller fluctuations in the electrical properties of the semiconductor components.

According to the disclosure, the at least one buried semiconductor zone is to be designed or dimensioned in such a way that, above a certain predefined current density in the semiconductor body during the turn-off process, it injects charge carriers of a charge type that at least partially compensates the locally excessive charge carrier current of the other complementary charge type. What is important for this is in particular the lateral extent or width and the doping concentration of the buried semiconductor zones and the doping concentration of the adjacent basic doping of the inner zone.

According to an advantageous embodiment of the disclosure, the buried semiconductor zone has a maximum doping concentration preferably between about $2\times10^{16}$ cm$^{-3}$ to about $5\times10^{17}$ cm$^{-3}$, with its doping profile advantageously being of the Gaussian type. Furthermore, it extends over a depth of preferably about 1.5 μm to about 15 μm.

In order to protect, in particular, the edge or the edge region adjacent to the edge of the semiconductor body against excessive electrical field strengths, an advantageous embodiment of the disclosure provides to dispose the buried semiconductor zone only in an outer or edge region of the semiconductor zone. In the case of a disk-shaped semiconductor body, for example a disk cell diode, the buried semiconductor zone can advantageously be formed in an annular manner in the outer or edge region of the semiconductor body. In this embodiment, the buried semiconductor zone can come up to the edge of the semiconductor body.

According to another advantageous embodiment of the disclosure, the buried semiconductor zone is disposed laterally spaced from the edge of the semiconductor body. This prevents a field strength peak occurring at the edge of the semiconductor body from coming too close to the buried semiconductor zone, which, in the static blocking state, can result in an increased blocking current or even in a reduction of the blocking voltage. The lateral distance of the buried semiconductor zone from the edge of the semiconductor zone is preferably between about 30 μm to about 200 μm.

Another advantageous embodiment of the disclosure provides that, between the first semiconductor zone and the inner zone, a field stop zone is provided, which extends parallel to the first semiconductor zone and is of the first conduction type with a doping concentration that is between the doping concentration of the first semiconductor zone and the doping concentration of the inner zone, wherein the field stop zone is positioned in front of the buried semiconductor zone in the direction of the inner zone. Thus, with the thickness of the inner zone staying the same, the static blocking capability of the semiconductor component is effectively increased by the field stop zone of the first conduction type with the higher penetration depth being positioned in front of the heavily doped semiconductor zone of the first conduction type with a low penetration depth. The penetration of the electrical field into the field stop zone is permitted. The field stop zone provided in this manner additionally counteracts the excessive rise of the field strength at the edge of the semiconductor body by the space charge of the second charge type, which is additionally made available in the blocking state. The field stop zone has a doping concentration of preferably between about $5\times10^{14}$ cm$^{-3}$ to about $5\times10^{16}$ cm$^{-3}$ and a penetration depth of preferably between about 10 μm to about 70 μm. Moreover, the doping profile of the field stop zone preferably is of the Gaussian type. The field stop zone can be produced in a manner known per se, for example by predeposition of a dopant, for example phosphorus or selenium for the case of an n-doped field stop zone, or by implantation of the dopant with subsequent indiffusion.

According to another advantageous embodiment of the disclosure, a second edge chamfer with a second angle with respect to the transition from the first semiconductor zone to the inner zone or to the field stop zone is provided, which extends at least along the edge of the first semiconductor zone and the buried semiconductor zone, wherein the absolute value of the second angle is smaller than the absolute value of the first angle. Preferably, the absolute value of the second angle is between about 1° to about 5°. Thus, the exit point of the space-charge zone on the side of the first semiconductor zone is located in the region of the field stop zone and is widened towards the edge by the edge chamfer, whereby the height of the field strength peak at the edge is reduced.

Another advantageous embodiment of the disclosure provides that several buried semiconductor zones are disposed in a plane and laterally spaced from one another. In this way, a particularly high level of turn-off robustness of the semiconductor component can be obtained. Alternatively, or as an addition to this embodiment, a buried semiconductor zone may also comprise breaks configured in the form of strips and/or a two-dimensional hole arrangement. The breaks or openings of this buried semiconductor zone are preferably 6 μm at most, and particularly preferably about 2 μm to about 6 μm. In the case of the two-dimensional hole arrangement, the breaks or holes, which are also referred to as shorts, can be disposed in a full-surface buried semiconductor zone, wherein the diameter of these shorts can also be greater than 6 μm, preferably up to about 10 μm. In particular, the diameter of the shorts can also vary towards the edge of the semiconductor body, for example, become smaller. Moreover, the buried semiconductor zone provided with breaks or openings can also extend over the entire diameter of the semiconductor body, whereby the turn-off robustness of the semiconductor body can be increased further.

DETAILED DESCRIPTION OF THE FIGURES

Figure 1:
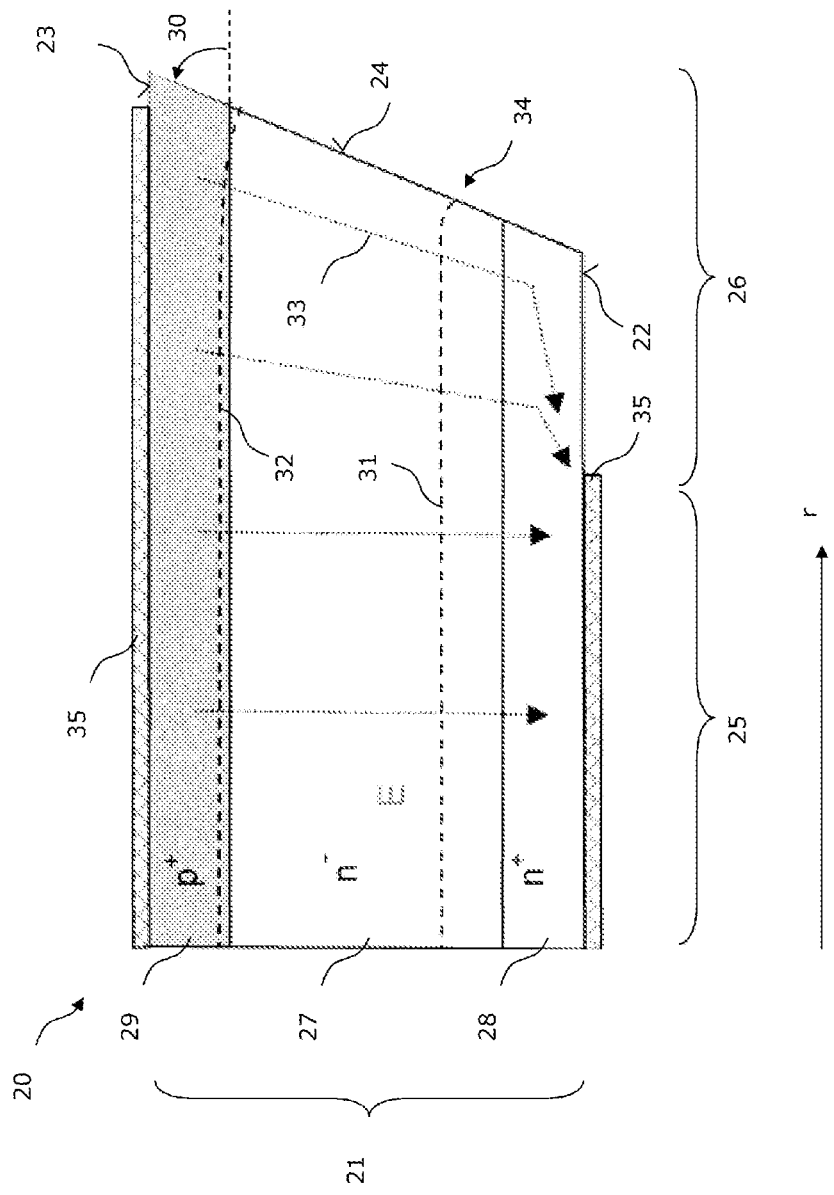
FIG. 1 shows a section of a cross-sectional side view of a semiconductor component according to the prior art configured as a diode.

FIG. 1 shows a section of a cross-sectional side view of a semiconductor component 20 according to the prior art configured as a diode. The semiconductor component 20, or the diode 20, comprises a semiconductor body 21 with a first side 22, a second side 23 and an edge 24. In the radial direction r, the semiconductor body 21 is divided into an inner region 25 and an edge region 26.

It is noted that the inner region 25 of the semiconductor body 21, with regard to its surface area, is considerably larger than the edge region 26, and that the edge region 26, in the top view onto the semiconductor body 20, completely surrounds the inner region 25 in the circumferential direction in a circular manner. Since the crucial aspect of the present disclosure lies in the edge region 26, only the edge region 26 and a small section of the inner region 25 are shown in the Figures for reasons of clarity.

The semiconductor component 20, which in FIG. 1 is configured as a diode, in particular as a disk cell diode, further comprises, in the vertical direction, an inner zone 27 with a basic doping of a first conduction type, which forms the base of the power diode 20, a first semiconductor zone 28 of the first conduction type disposed between the first side 22 and the inner zone 27, and a second semiconductor zone 29 of a second conduction type complementary to the first conduction type disposed between the second side 23 and the inner zone 27. In the example shown in FIG. 1, the inner zone 27 is lightly n-doped, the first semiconductor zone is heavily n-doped, and the second semiconductor zone 29 is heavily p-doped. In a manner known per se, the terms "lightly doped" and "heavily doped" indicate that the doping concentrations of the first and second semiconductor zones 28 and 29 are each considerably higher than the doping concentration of the inner zone 27. Common doping concentration of the heavily doped regions are typically between about $10^{18}$ cm$^{-3}$ to about $10^{21}$ cm$^{-3}$, whereas the doping concentration of the lightly doped inner zone 27 is usually between about $10^{12}$ cm$^{-3}$ to about $10^{15}$ cm$^{-3}$. In the example shown, the second semiconductor zone 29 and the inner zone 27 form a p-n transition.

As is further apparent from FIG. 1, the diode 20, or the semiconductor body 21, has a first edge chamfer of the edge 24 with a first angle 30, at which the extension plane of the transition, which in the example shown in FIG. 1 is that of the p-n transition, from the second semiconductor zone 29 to the inner zone 27 intersects the edge 24. In the diode 20 shown, the edge chamfer extends along the edge of the first and second semiconductor zones 28, 29 and of the inner zone 27, and thus along the entire edge 24 of the semiconductor body 21. With respect to the p-n transition in the example of the diode 20 shown in FIG. 1, the angle 30 is a positive angle, which is preferably selected to be between about 25° to about 50°.

Furthermore, FIG. 1 shows the penetration depth 31 and the penetration depth 32 of the space-charge zone of the diode 20 in the direction of the first semiconductor zone 28 (on the side of the cathode) and in the direction of the second semiconductor zone 29 (on the side of the anode). It is to be understood that the space-charge zones shown in FIG. 1 merely indicate schematic profiles and do not depict the case of the maximum possible blocking voltage for the static breakdown case.

Moreover, FIG. 1 shows by means of corresponding arrows 33 the profile of the current density in the on-state. Since the surface area of the second semiconductor zone 29 at the edge is comparably larger than the surface area of the first semiconductor zone 28, an increased current density, which is proportional to the charge stored in the semiconductor body 21, may occur during the on-state operation, and thus also during the depletion phase, at the edge in the vicinity of the region marked with 34. Due to this residual charge in the edge region, an increased space charge having electrons forms during the depletion phase which follows the on-state phase in time, which may result in a dynamic avalanche in the region of the edge 24, particularly in the vicinity of the region marked with 34.

Metal coatings 35, via which the semiconductor component 20 can be electrically connected to its surroundings, are provided in a manner known per se on the respective outer side or contact surfaces of the first side 22 and the second side 23 of the semiconductor body 21.

Figure 2:
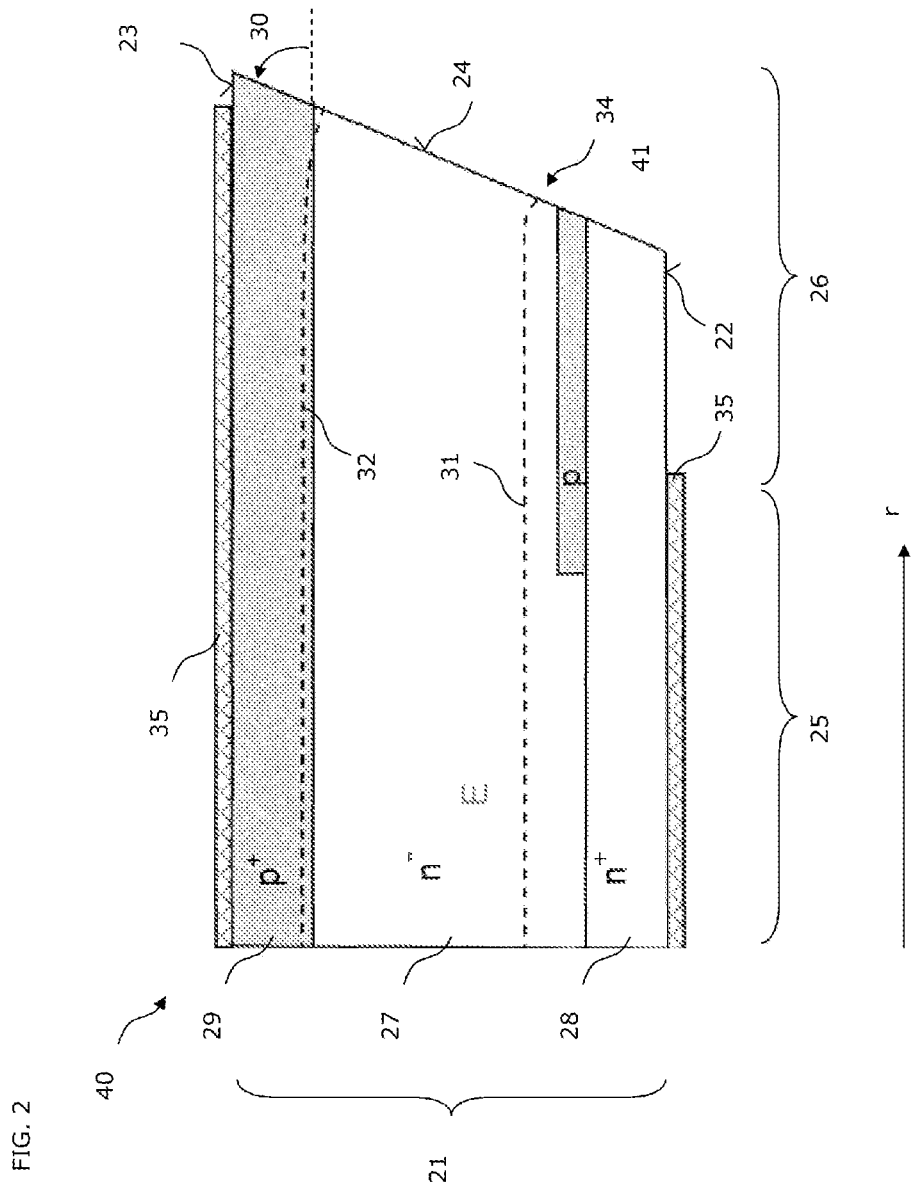
FIG. 2 shows a section of a cross-sectional side view of a first exemplary embodiment of a semiconductor component according to the disclosure configured as a diode.

A section of a cross-sectional side view of a first exemplary embodiment of a semiconductor component 40 according to the disclosure, which is configured as a diode, in particular a disk cell diode, is shown in FIG. 2. The exemplary embodiment of the diode 40 differs from the diode 20 depicted in FIG. 1 only in that at least one buried semiconductor zone 41 of the second charge type with a doping concentration higher than the doping concentration of the inner zone 27 is provided between the first semiconductor zone 28 and the inner zone 27. In the exemplary embodiment shown in FIG. 2, the buried semiconductor zone 41 is p-doped. In particular, the buried semiconductor zone 41 is configured as an annular p-ring. As is apparent from FIG. 2, the buried semiconductor zone 41 is substantially only provided in the edge region 26 of the semiconductor body 21, in order to, in particular, reduce the current density there during turn-off, and thus to delay the occurrence of the dynamic avalanche.

During the depletion phase, the buried semiconductor zone 41 injects in an advantageous manner holes that compensate the electrons generated by the dynamic avalanche. Due to the current relief of the edge 24 or of the edge region 26, excessive field strength peaks at the edge 24, in particular in the region of the cathode-side region 34, are avoided. Furthermore, the production of the buried semiconductor zone 41, for example by means of predeposition or ion implantation and a high-temperature step subsequent thereto, permits an exact reproducibility of the doping. Thus, fluctuations of the electrical properties of the semiconductor components 40, particularly of the above-mentioned conditions that arise during the depletion phase, are avoided or considerably reduced.

According to the disclosure, the dimensioning of the buried semiconductor zone 41 is such that, above a certain predefinable current density, it is capable of injecting charge carriers, holes in the case shown in FIG. 2, which are able to compensate at least partially the locally excessive electron current. What is crucial with regard to this dimensioning is, in particular, the design of the lateral extent or vertical depth and doping of the buried semiconductor zone 41 as well as the doping concentration of the adjacent inner zone 27. Preferably, the maximum of the doping concentration of the buried semiconductor zone 41 is between about $2 \times 10^{16}$ cm$^{-3}$ to about $5 \times 10^{17}$ cm$^{-3}$, wherein it preferably comprises a doping profile of the Gaussian type. The vertical extent of the buried semiconductor zone 41 is preferably between about 1.5 μm to about 15 μm. The lateral extent or width of the p-ring 41 in this case extends at least over the entire non-metallized region of the side 22 and is preferable between about 50 μm to about 1000 μm.

Figure 3:
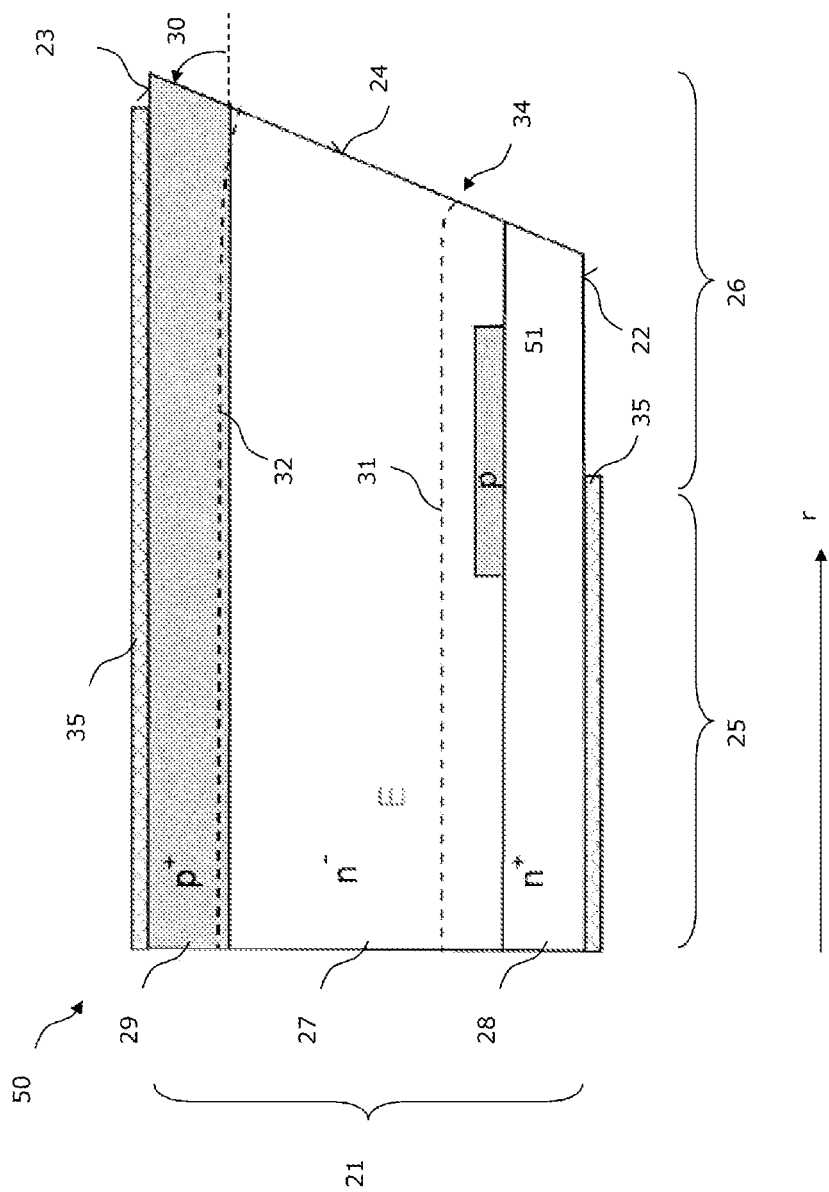
FIG. 3 shows a section of a cross-sectional side view of a second exemplary embodiment of a semiconductor component according to the disclosure configured as a diode.

FIG. 3 shows a section of a cross-sectional side view of a second exemplary embodiment of a semiconductor component 50 according to the disclosure, which is configured as a diode. As is apparent from FIG. 3, the diode 50 comprises a buried semiconductor zone 51, which in this exemplary embodiment is disposed laterally spaced from the edge 24 of the semiconductor body 21. The lateral distance is preferably between about 30 μm and 200 μm. It is prevented by means of this arrangement of the buried semiconductor zone 51 that the field strength peak in the region 34 is able to come up closely to the buried semiconductor zone 51. In the static blocking state, this could result in an increased blocking current or even a reduction of the blocking voltage.

Figure 4:
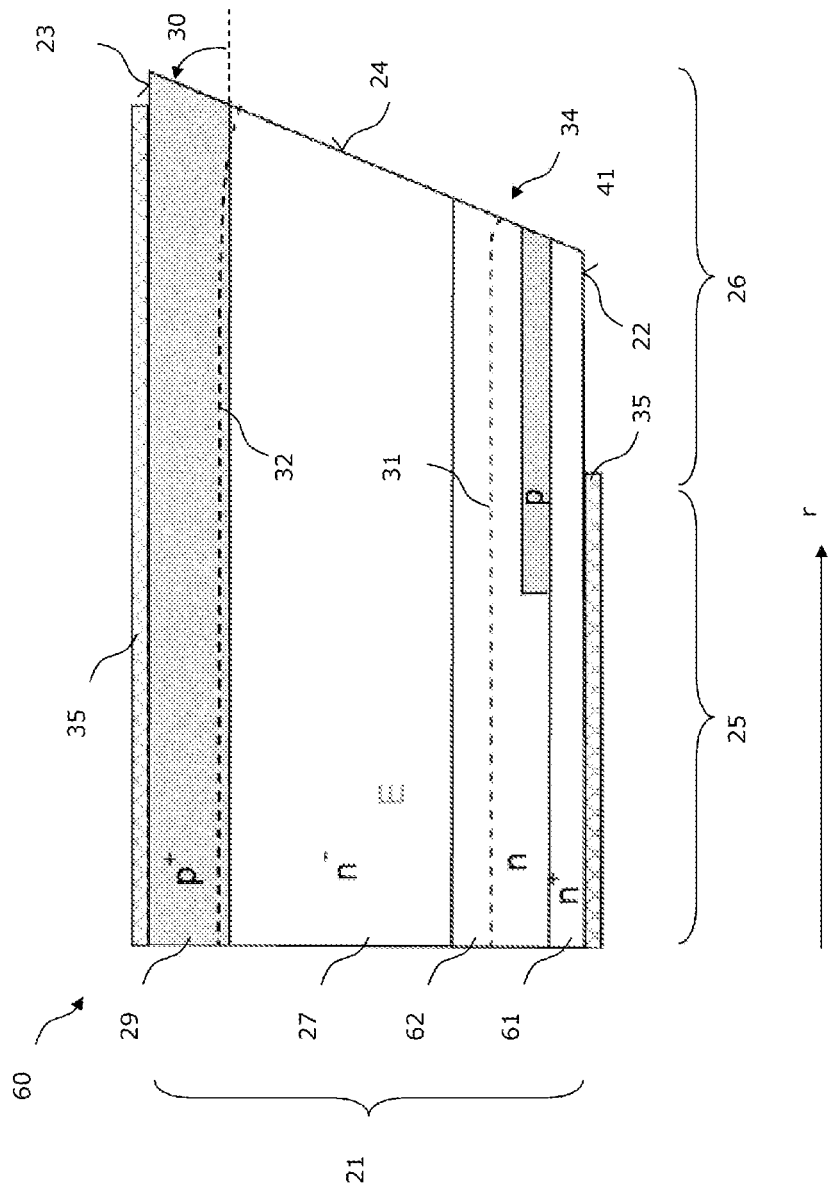
FIG. 4 shows a section of a cross-sectional side view of a third exemplary embodiment of a semiconductor component according to the disclosure configured as a diode.

Another option for preventing the field strength peaks from coming up too closely to the buried semiconductor zone 51 in the region 34 is shown in FIG. 4, which shows a section of a cross-sectional side view of a third exemplary embodiment of a semiconductor component 60 according to the disclosure, which is configured as a diode. Similar to the diode 40 shown in FIG. 2, the diode 60 comprises a buried semiconductor zone 41 that extends up to the edge 24. Unlike the diode 40, however, the first semiconductor zone 28 shown in FIG. 2 in the diode 60 is now divided into a heavily doped first semiconductor zone 61 of a low penetration depth and a field stop zone 62 of a higher penetration depth positioned in front thereof. In other words, between the first semiconductor zone 61 and the inner zone 27, a field stop zone 62 is provided, which extends parallel to the first semiconductor zone 61 and is of the first conduction type with a doping concentration that is between the doping concentration of the first semiconductor zone 61 and the doping concentration of the inner zone 27. The field stop zone 62 is positioned in front of the buried semiconductor zone 41 in the direction of the inner zone 27. The penetration of the electrical field into this buffer or field stop zone 62 is permitted, so that the static blocking capability of the semiconductor component 60 is thus increased, with the thickness of the inner zone 27 staying the same. In the blocking state, the higher concentration of the positive space charge within the space-charge zone of the field stop zone 62 compensates the negative dynamic space charge of the electrons and thus counteracts a rise of the field strength that is too excessive in the region of the location 34.

According to the disclosure, the buffer or field stop zone 62 is dimensioned in such a way that its doping concentration is preferably between about $5\times10^{14}$ cm$^{-3}$ to about $5\times10^{16}$ cm$^{-3}$. The penetration depth of the field stop zone 62 is preferably between about 10 μm to about 70 μm. Moreover, the doping profile of the field stop zone 62 preferably is of the Gaussian type. The field stop zone can be produced in a manner known per se, for example by predeposition or implantation of a dopant, for example phosphorus or selenium, with subsequent indiffusion.

Figure 5:
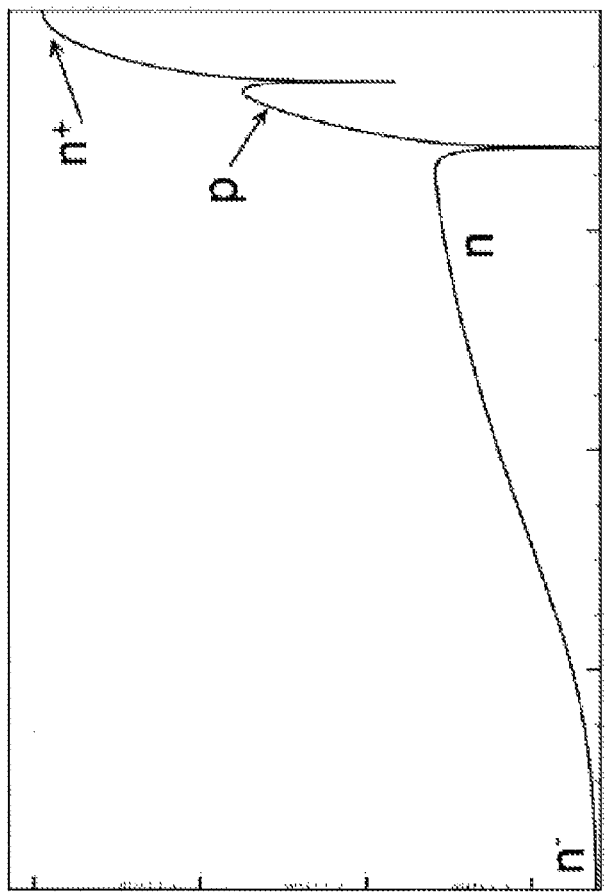
FIG. 5 shows an exemplary doping profile of the semiconductor component shown in FIG. 4.

FIG. 5 illustrates an exemplary doping profile of the semiconductor component 60 shown in FIG. 4. FIG. 5 depicts, from the left to the right, the basic doping of the lightly n-doped inner zone 27, the more heavily n-doped field stop zone 62, the even more heavily p-doped buried semiconductor zone 41, and, finally, the heavily n-doped first semiconductor zone 61.

Figure 6:
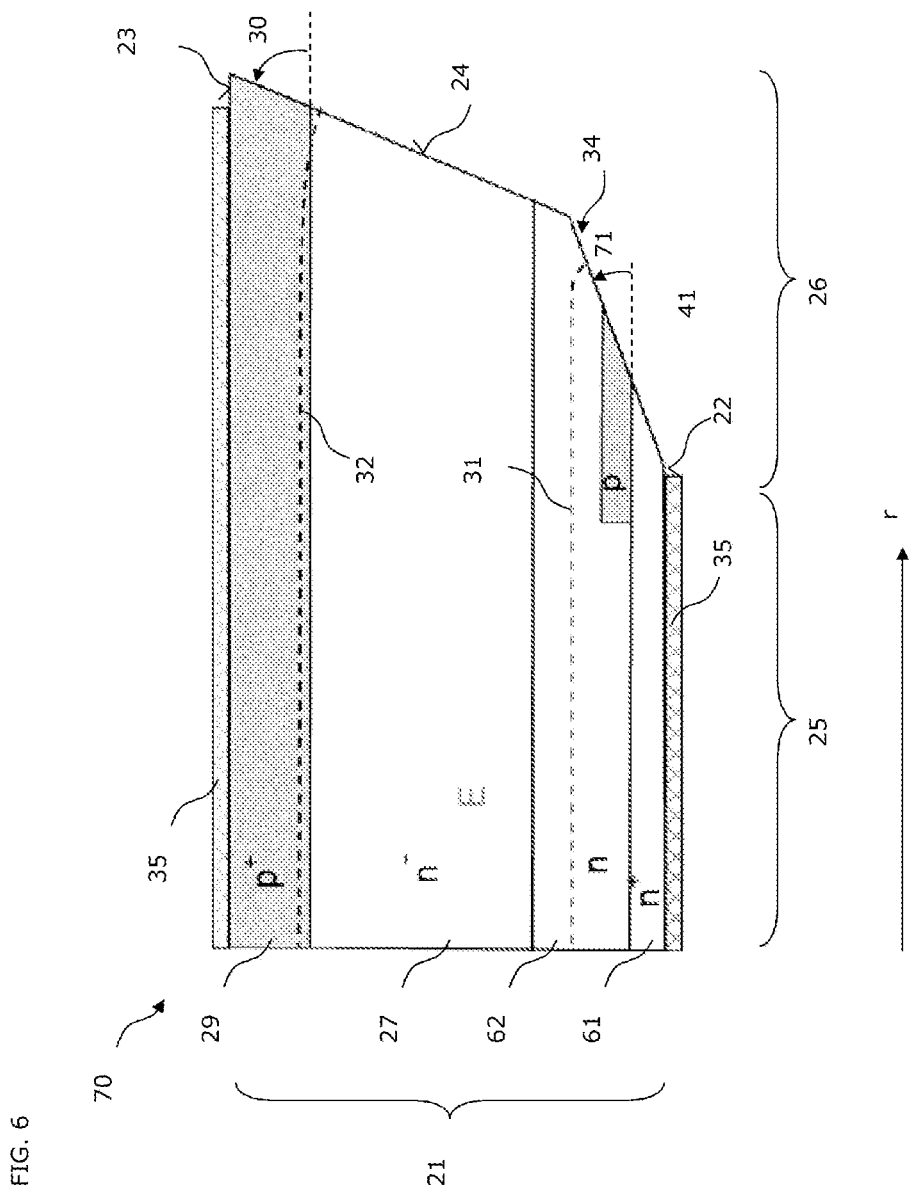
FIG. 6 shows a section of a cross-sectional side view of a fourth exemplary embodiment of a semiconductor component according to the disclosure configured as a diode.

FIG. 6 shows a section of a cross-sectional side view of a fourth exemplary embodiment of a semiconductor component 70 according to the disclosure, which is configured as a diode. Compared with the diode 60 shown in FIG. 4, the diode 70 has a second edge chamfer with a second, shallower angle 71 with respect to the transition from the first semiconductor zone 61 to the inner zone 27 or to the field stop zone 62. In the exemplary embodiment shown, the second edge chamfer extends along the edge of the first semiconductor zone 61 and of the buried semiconductor zone 41, the absolute value of the second angle 71 being smaller than the absolute value of the first angle 30, and preferably being between about 1° to about 5°. With respect to the n$^+$n transition from the first semiconductor zone 61 to the field stop zone 62, the angle 71 is a negative angle. The exit point 34 of the space-charge zone on the side of the first semiconductor zone 61 is located in the region of the field stop zone 62 and has a shallow angle at this location, which reduces the height of the field strength peak by widening the space-charge zone. It is to be understood that the exit shown in FIG. 6 does not show the conditions of the maximum blocking voltage applied, but only serves for the schematic illustration of the general position and shape of the space-charge zone.

Figure 7:
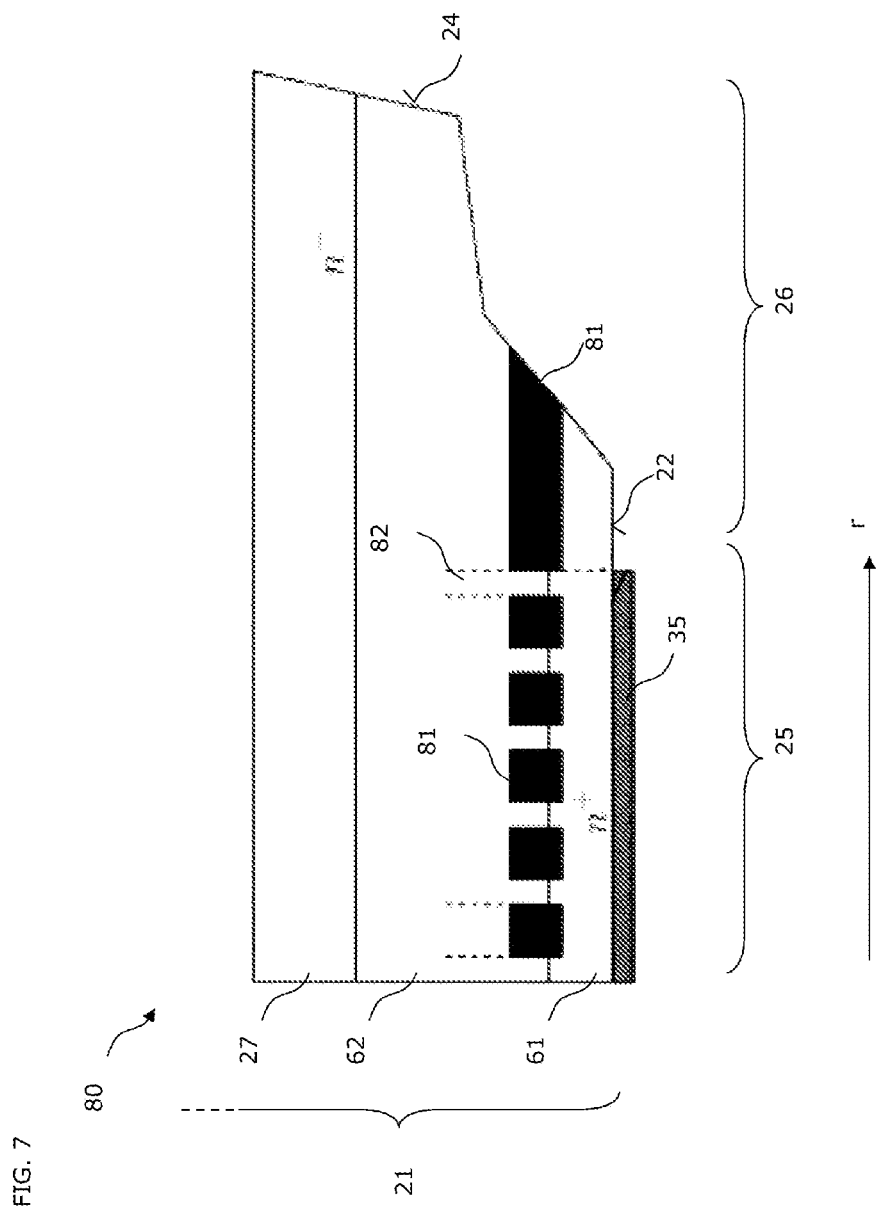
FIG. 7 shows a section of a cross-sectional side view of a fifth exemplary embodiment of a semiconductor component according to the disclosure configured as a diode.

FIG. 7 shows a section of a cross-sectional side view of a fifth exemplary embodiment of a semiconductor component 80 according to the disclosure, which is configured as a diode. In contrast to the buried semiconductor zone 41 of the diode 70 shown in FIG. 6, the diode 80 comprises several buried semiconductor zones 81, which are disposed in a plane and laterally spaced from one another. As is apparent from FIG. 7, the buried semiconductor zones 81 do not have to limit themselves to the edge region 26 of the semiconductor body 21, but can rather also be disposed distributed over the inner zone 25 of the semiconductor body 21, and thus over the entire cathode surface area. Such an arrangement not only increases the turn-off robustness of the semiconductor component in the edge region, but additionally also on the entire surface of the diode 80.

In a top view onto the semiconductor body 21, the individual buried semiconductor zones 81 in the exemplary embodiment shown in FIG. 8 constitute concentric rings around the center of the semiconductor body 21, which is not visible in FIG. 7. For this purpose, the openings or breaks 82 between the buried semiconductor zones 81 are configured, for example, as strips with a width of no more than 6 μm, preferably between about 2 μm and 6 μm. The last opening 82 before the outermost ring of the semiconductor zones 81, which is buried in the edge region 26, can be smaller than the other openings 82. In the exemplary embodiment of the diode 80 shown in FIG. 7, the width of the opening 82 before the outermost ring of the semiconductor zones 81, which is buried in the edge region 26, is about 4.5 μm. In the exemplary embodiment shown, the width of the buried semiconductor zones 81 other than the outermost ring of the semiconductor zones 81, which is buried in the edge region 26, is about 48 μm. Preferably, the outermost ring of the semiconductor zones 81 extends from the edge 24 of the semiconductor body 21 in the lateral direction inwards, at least up to the metal coating 35.

The openings or breaks 82 can also be provided as two-dimensional hole arrangement in a full-surface buried semiconductor zone. In that case, the diameter of these so-called "shorts" can be greater than the above-mentioned width of the opening or break strips, preferably up to about 10 μm. In particular, the diameter of the shorts can also vary towards the edge 24 of the semiconductor component 80, for example, become smaller.

Such a structure with breaks or openings 82 in the buried semiconductor zone 81 and a two-dimensional hole arrangement can be produced, for example, by a masked boron implantation with a high implantation energy and a subsequent annealing step, optionally, depending on the desired penetration depth for the buried layer, also with a subsequent diffusion step. Instead of boron, gallium or aluminum are also possible acceptors. Production is also possible by means of a predeposition by means of a masked boron diffusion and a subsequent drive-in step.

The semiconductor component according to the disclosure was explained in more detail with reference to exemplary embodiments shown in the Figures. However, the semiconductor component is not limited to the embodiments described herein, but also includes embodiments having the same effects. In particular, the disclosure is not limited to the embodiment of the semiconductor component according to the disclosure as a diode described herein, but also includes all further semiconductor components in which, as described herein, the current density in the edge region of a semiconductor body is reduced by means of at least one buried semiconductor zone and the occurrence of a dynamic avalanche is thus delayed, and in which the buried semiconductor zone, in case of a dynamic avalanche, is able to inject charge carriers of its own conduction type in order to compensate the charge carriers generated by the dynamic avalanche.

In a preferred use, the semiconductor component according to the disclosure is configured as a fast-switching disk cell diode with good high-voltage compatibility and improved turn-off robustness.

The invention claimed is:

1. A semiconductor component, comprising:
    a semiconductor body with a first side, a second side, and an edge,
    an inner zone with a basic doping of a first conduction type,
    a first semiconductor zone, which is disposed between the first side and the inner zone and is of the first conduction type with a doping concentration higher than that of the inner zone,
    a second semiconductor zone, disposed between the second side and the inner zone and is of a second conduction type complementary to the first conduction type with a doping concentration higher than that of the inner zone,
    at least one first edge chamfer extending at a first angle to the extension plane of a transition from the second semiconductor zone to the inner zone at least along the edge of the second semiconductor zone and the inner zone,
    wherein at least one buried semiconductor zone of the second conduction type with a doping concentration higher than that of the inner zone is provided between the first semiconductor zone and the inner zone, and extends substantially parallel to the first semiconductor zone,
    wherein a second edge chamfer with a second angle with respect to a transition from the first semiconductor zone to the inner zone is provided, which extends at least along edge of the first semiconductor zone and the buried semiconductor zone, wherein the absolute value of the second angle is smaller than the absolute value of the first angle.

2. The semiconductor component according to claim 1, wherein
    the buried semiconductor zone is provided only in an edge region of the semiconductor body.

3. The semiconductor component according to claim 1, wherein
    the buried semiconductor zone is disposed laterally spaced from the edge of the semiconductor body, the lateral distance being between 30 μm and 200 μm.

4. The semiconductor component according to claim 1, wherein
    the buried semiconductor zone has a maximum doping concentration of between about $2\times10^{16}$ cm$^{-3}$ to about $5\times10^{17}$ cm$^{-3}$, and a vertical depth of between about 1.5 μm to about 15 μm.

5. The semiconductor component according to claim 1, wherein
    a field stop zone is provided between the first semiconductor zone and the inner zone, which extends parallel to the first semiconductor zone and is of the first conduction type with a doping concentration that is between the doping concentration of the first semiconductor zone and the doping concentration of the inner zone, wherein the field stop zone is positioned in front of the buried semiconductor zone in the direction of the inner zone.

6. The semiconductor component according to claim 1, wherein
    a plurality of buried semiconductor zones are disposed in a plane and laterally spaced from one another.

7. The semiconductor component according to claim 6, wherein a plurality of
    breaks in the form of strips and/or a two-dimensional hole arrangement are provided in the buried semiconductor zone.

8. The semiconductor component according to claim 6, wherein
    the buried semiconductor zone extends over the entire diameter of the semiconductor body.

9. The semiconductor component according to claim 6, wherein
    the semiconductor component is configured as a disk cell diode.

* * * * *